(12) United States Patent
Clevenger et al.

(10) Patent No.: US 11,894,265 B2
(45) Date of Patent: Feb. 6, 2024

(54) TOP VIA WITH DAMASCENE LINE AND VIA

(71) Applicant: INTERNATIONAL BUSINESS MACHINES CORPORATION, Armonk, NY (US)

(72) Inventors: Lawrence A. Clevenger, Saratoga Springs, NY (US); Brent Anderson, Jericho, VT (US); Kisik Choi, Watervliet, NY (US); Nicholas Anthony Lanzillo, Wynantskill, NY (US); Christopher J. Penny, Saratoga Springs, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 187 days.

(21) Appl. No.: 17/479,346

(22) Filed: Sep. 20, 2021

(65) Prior Publication Data
US 2022/0005732 A1    Jan. 6, 2022

Related U.S. Application Data

(62) Division of application No. 16/743,955, filed on Jan. 15, 2020, now Pat. No. 11,164,777.

(51) Int. Cl.
*H01L 21/768* (2006.01)
*H01L 23/522* (2006.01)
*H01L 23/532* (2006.01)

(52) U.S. Cl.
CPC .. *H01L 21/76843* (2013.01); *H01L 21/76802* (2013.01); *H01L 21/76879* (2013.01); *H01L 23/5226* (2013.01); *H01L 23/53266* (2013.01)

(58) Field of Classification Search
CPC ......... H01L 21/76843; H01L 21/76802; H01L 21/76879; H01L 23/5226; H01L 23/53266;
(Continued)

(56) References Cited

U.S. PATENT DOCUMENTS 4,746,621 A * 5/1988 Thomas ............ H01L 21/76879
257/E21.295
5,693,568 A   12/1997 Liu et al.
(Continued)

OTHER PUBLICATIONS

List of IBM Patents or Patent Applications Treated as Related dated Sep. 20, 2021, 2 pages.

*Primary Examiner* — Shahed Ahmed
*Assistant Examiner* — Vicki B. Booker
(74) *Attorney, Agent, or Firm* — Tutunjian & Bitetto, P.C.; Robert Richard Aragona

(57) ABSTRACT

A method of forming a top via is provided. The method includes forming a sacrificial trench layer and conductive trench plug in an interlayer dielectric (ILD) layer on a conductive line. The method further includes forming a cover layer on the ILD layer, sacrificial trench layer, and conductive trench plug, and forming a sacrificial channel layer and a conductive channel plug on the conductive trench plug. The method further includes removing the cover layer and the ILD layer to expose the sacrificial trench layer and the sacrificial channel layer. The method further includes removing the sacrificial trench layer and the sacrificial channel layer, and forming a barrier layer on the conductive channel plug and conductive trench plug.

19 Claims, 8 Drawing Sheets

(58) Field of Classification Search
CPC ......... H01L 21/76834; H01L 21/76852; H01L 21/76865; H01L 21/76885; H01L 21/76883
See application file for complete search history.

(56) References Cited

U.S. PATENT DOCUMENTS

| | | |
|---|---|---|
| 6,218,287 B1 | 4/2001 | Matsumoto |
| 6,245,669 B1 | 6/2001 | Fu et al. |
| 6,291,334 B1 | 9/2001 | Somekh |
| 6,424,044 B1 | 7/2002 | Han et al. |
| 6,686,273 B2 | 2/2004 | Hsu et al. |
| 7,259,087 B2 | 8/2007 | Jung |
| 7,326,651 B2 | 2/2008 | Baks et al. |
| 7,947,594 B2 | 5/2011 | Louis |
| 8,611,055 B1 | 12/2013 | Pakala et al. |
| 9,613,861 B2 | 4/2017 | Anderson et al. |
| 10,049,920 B1 | 8/2018 | Anderson et al. |
| 2005/0110145 A1* | 5/2005 | Elers ................... H01L 21/288 257/E21.585 |
| 2005/0112957 A1 | 5/2005 | Yang et al. |
| 2012/0313256 A1* | 12/2012 | Lu ....................... H01L 21/7681 257/E21.586 |
| 2015/0137377 A1* | 5/2015 | Bao ................... H01L 21/76849 257/758 |
| 2015/0270211 A1* | 9/2015 | Kobrinsky ........ H01L 21/76895 257/758 |
| 2016/0300757 A1 | 10/2016 | Dash et al. |
| 2017/0263547 A1* | 9/2017 | Adusumilli ....... H01L 23/53266 |

\* cited by examiner

TOP VIA WITH DAMASCENE LINE AND VIA

BACKGROUND

The present invention generally relates to top via structures, and more particularly to top via structures with a via above the line.

A metal interconnect structure can include multiple metallization layers with interconnecting vias. As devices get smaller and closer together, forming vias, including skip vias, at an acceptable pitch at the lower metallization layers becomes more difficult.

SUMMARY

In accordance with an embodiment of the present invention, a method of forming a top via is provided. The method includes forming a sacrificial trench layer and conductive trench plug in an interlayer dielectric (ILD) layer on a conductive line. The method further includes forming a cover layer on the ILD layer, sacrificial trench layer, and conductive trench plug, and forming a sacrificial channel layer and a conductive channel plug on the conductive trench plug. The method further includes removing the cover layer and the ILD layer to expose the sacrificial trench layer and the sacrificial channel layer. The method further includes removing the sacrificial trench layer and the sacrificial channel layer, and forming a barrier layer on the conductive channel plug and conductive trench plug.

In accordance with another embodiment of the present invention, a method of forming a top via is provided. The method includes forming one or more openings in a masking layer on an interlayer dielectric (ILD) layer, wherein each of the one or more openings is over a separate one of one or more of the conductive lines below the ILD layer. The method further includes forming a trench from each of the one or more openings through the ILD layer to the underlying one of one or more of the conductive lines, and forming a trench liner in each of the one or more trenches. The method further includes forming a conductive trench plug on the trench liner in each of the trenches, and forming a cover layer on the interlayer dielectric layer and conductive trench plugs. The method further includes forming a channel in the cover layer that exposes a top surface of one of the one or more conductive trench plugs.

In accordance with another embodiment of the present invention, a top via is provided. The top via includes a trench plate on a conductive line, and a conductive trench plug on the trench plate. The top via further includes a channel plate on the conductive trench plug, and a conductive channel plug on the channel plate. The top via further includes a barrier layer on the conductive channel plug, channel plate, conductive trench plug, and trench plate.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a damascene via fabricated on top of a damascene line such that the conductive fill of the via can be different from the conductive fill of the line.

Embodiments of the present invention provide that the conductive via and the conductive line can be both patterned in the same dielectric material, which can be removed and replaced following the formation of the conductive via.

Embodiments of the present invention provide a dielectric barrier materials that can be deposited conformally around the line and via prior to deposition of a dielectric capping layer.

Exemplary applications/uses to which the present invention can be applied include, but are not limited to: logic devices, including, but not limited to, NAND gates, NOR gates, XOR gates, and other devices having a back-end-of-line pitch below 30 nanometers (nm).

It is to be understood that aspects of the present invention will be described in terms of a given illustrative architecture; however, other architectures, structures, substrate materials and process features and steps can be varied within the scope of aspects of the present invention.

Figure 1:
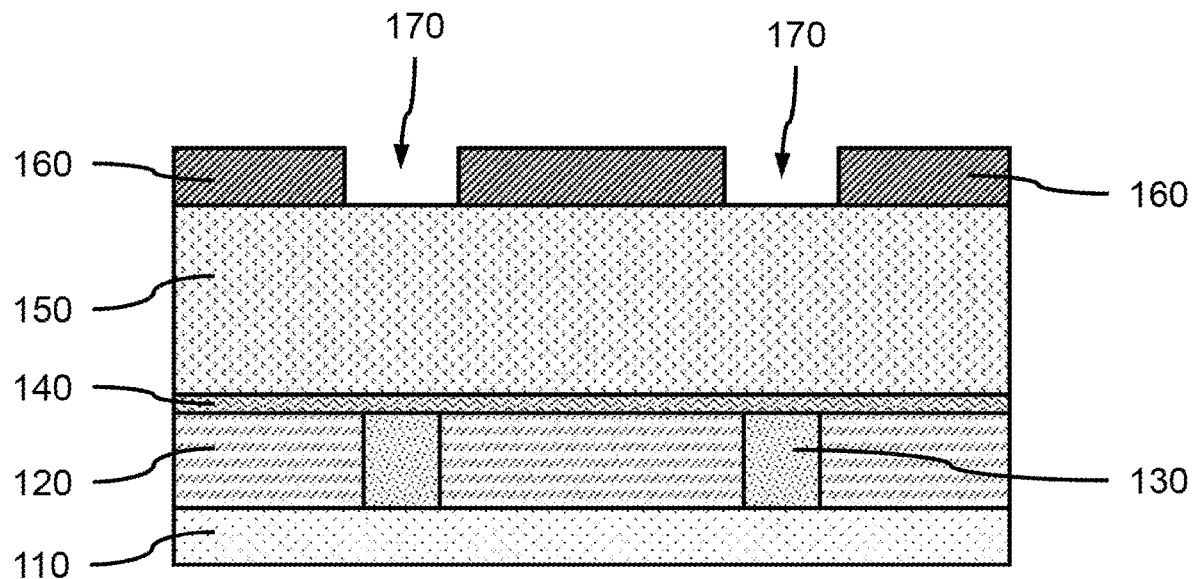
FIG. 1 is a cross-sectional side view showing an etch stop layer on metal lines in a fill layer, and a masking pattern on an interlayer dielectric layer on the etch stop layer, in accordance with an embodiment of the present invention.

Referring now to the drawings in which like numerals represent the same or similar elements and initially to FIG. 1, a cross-sectional side view of an etch stop layer on metal lines in a fill layer, and a masking pattern on an interlayer dielectric layer on the etch stop layer is shown, in accordance with an embodiment of the present invention.

In one or more embodiments, one or more conductive lines 130 can be formed in a fill layer 120 on a substrate 110. The conductive lines 130 can be a conductive material, including, but not limited to, a metal, for example, copper (Cu), aluminum (Al), tungsten (W), molybdenum (Mo), ruthenium (Ru), rhodium (Rh), cobalt (Co), and iridium (Jr), a metal compound, for example, tantalum nitride (TaN), titanium nitride (TiN), conductive carbon, for example, graphene, carbon nanotubes, and combinations thereof.

In various embodiments, the conductive lines 130 can have a width in a range of about 5 nanometers (nm) to about 30 nm, or about 10 nm, to about 20 nm, or about 15 nm, although other widths are also contemplated. In various embodiments, the conductive line pitch is in a range of 45 nm or less, or 30 nm or less, or about 20 nm to about 30 nm, or about 10 nm to about 25 nm, although other conductive line pitches are also contemplated. The line pitch would be greater than the width of the adjacent conductive lines to provide a distance between adjacent conductive lines.

In one or more embodiments, an etch stop layer 140 can be formed on one or more conductive lines 130 in a fill layer 120 on a substrate 110. The etch stop layer 140 can be formed by a conformal deposition, for example, atomic layer deposition (ALD), plasma enhanced ALD (PEALD), low pressure chemical vapor deposition (LPCVD), or a blanket deposition, for example, chemical vapor deposition (CVD), plasma enhanced CVD (PECVD), metal-organic chemical vapor deposition (MOCVD), physical vapor deposition (PVD), or a combination thereof.

In various embodiments, the etch stop layer 140 can be a metal compound, including, but not limited to, a metal nitride, for example, aluminum nitride (AlN), titanium nitride (TiN), aluminum oxide (AlO), a silicon nitride (SiN), a silicon carbide (SiC), and combinations thereof.

In various embodiments, the etch stop layer 140 can have a thickness in a range of about 2 nanometers (nm) to about 20 nm, or about 2 nm, to about 10 nm, or about 10 to about 20, or about 5 nm to 15 nm, although other thicknesses are also contemplated.

In one or more embodiments, an interlayer dielectric (ILD) layer 150 can be formed on the etch stop layer 140, where the interlayer dielectric layer 150 can be formed by a blanket deposition (e.g., CVD, PECVD, PVD, spin-on). The interlayer dielectric layer 150 can cover the etch stop layer 140.

In various embodiments, the interlayer dielectric layer 150 can be an insulating dielectric material, including, but not limited to, silicon oxide (SiO), a low-k dielectric material, and combinations thereof. A low-k dielectric material can be, for example, octomethylcyclotetrasiloxane ("OMCTS"), silicon carbonitride (SiCN), SiCOH, fluorine doped silicon oxide (SiO:F), carbon doped silicon oxide (SiO:C), and combinations thereof.

In various embodiments, the interlayer dielectric layer 150 can have a thickness in a range of about 5 nm to about 50 nm, or about 10 nm, to about 40 nm, or 15 nm to about 30 nm, although other thicknesses are also contemplated.

In one or more embodiments, a masking layer 160 can be formed on the interlayer dielectric layer 150. The masking layer can be patterned and developed to form openings 170 in the masking layer 160 over one or more of the conductive lines 130 using lithographic techniques. The masking layer 160 can be a photoresist material that can be patterned and developed.

Figure 2:
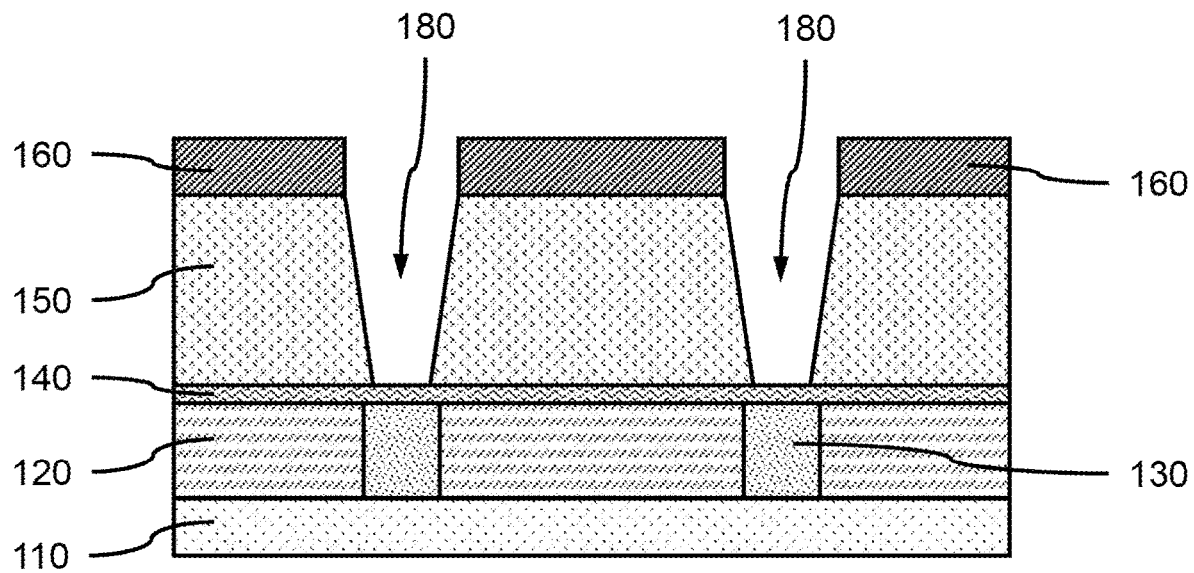
FIG. 2 is a cross-sectional side view showing trenches formed in the interlayer dielectric layer exposing the etch stop layer, in accordance with an embodiment of the present invention.

FIG. 2 is a cross-sectional side view showing trenches formed in the interlayer dielectric layer exposing the etch stop layer, in accordance with an embodiment of the present invention.

In one or more embodiments, portions of the interlayer dielectric layer 150 exposed by the opening(s) 170 can be removed to form trench(es) 180 in the interlayer dielectric layer 150. The trench(es) 180 can be formed by a selective, directional etch, for example, a reactive ion etch (RIE). Formation of the trench(es) 180 can expose the underlying portion(s) of the etch stop layer 140.

Figure 3:
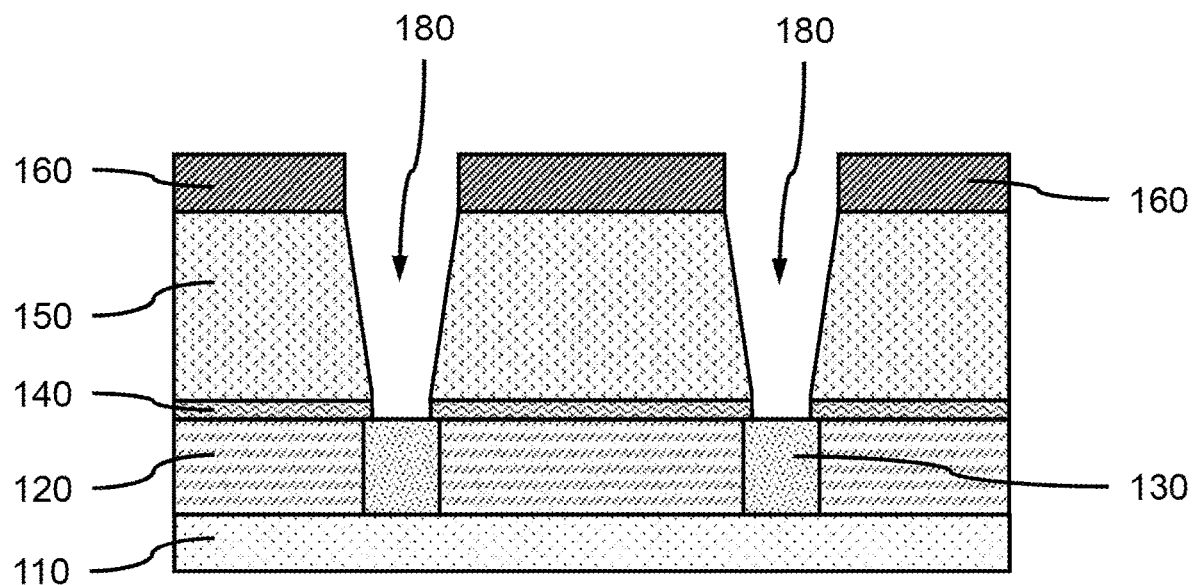
FIG. 3 is a cross-sectional side view showing removal of the exposed portion of the etch stop layer, in accordance with an embodiment of the present invention.

FIG. 3 is a cross-sectional side view showing removal of the exposed portion of the etch stop layer, in accordance with an embodiment of the present invention.

In one or more embodiments, the exposed portion(s) of the etch stop layer 140 can be removed, for example, using a selective, directional etch (e.g., RIE) to expose the underlying conductive line(s) 130.

Figure 4:
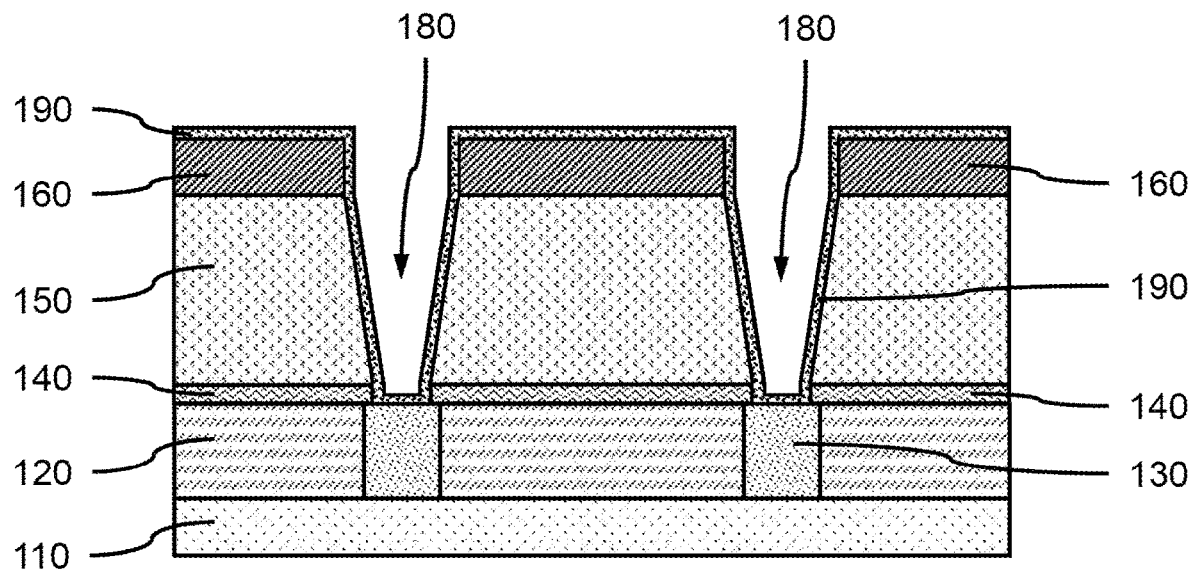
FIG. 4 is a cross-sectional side view showing a trench liner formed in the trenches and on the exposed portions of the metal lines, in accordance with an embodiment of the present invention.

FIG. 4 is a cross-sectional side view showing a trench liner formed in the trenches and on the exposed portions of the metal lines, in accordance with an embodiment of the present invention.

In one or more embodiments, a trench liner 190 can be formed in the trenches 180, where the trench liner 190 can be formed by a conformal deposition (e.g., ALD, PEALD). The trench liner 190 can be formed over the patterned masking layer 160. In various embodiments, the trench liner 190 can be formed on the flat regions above and between the conductive lines 130, which can be removed later during a chemical-mechanical polishing.

In various embodiments, the trench liner 190 can be a conductive metal, for example, molybdenum (Mo), ruthenium (Ru), rhodium (Rh), cobalt (Co), and combinations thereof.

In various embodiments, the trench liner 190 can have a thickness in a range of about 0.5 nm to about 5 nm, or about 1 nm to about 3 nm, although other thicknesses are also contemplated. The trench liner 190 can be sufficiently thick to promote a high quality gap fill of a conductive metal line material, and can reduce electromigration of the primary conductor in the conductive metal line.

Figure 5:
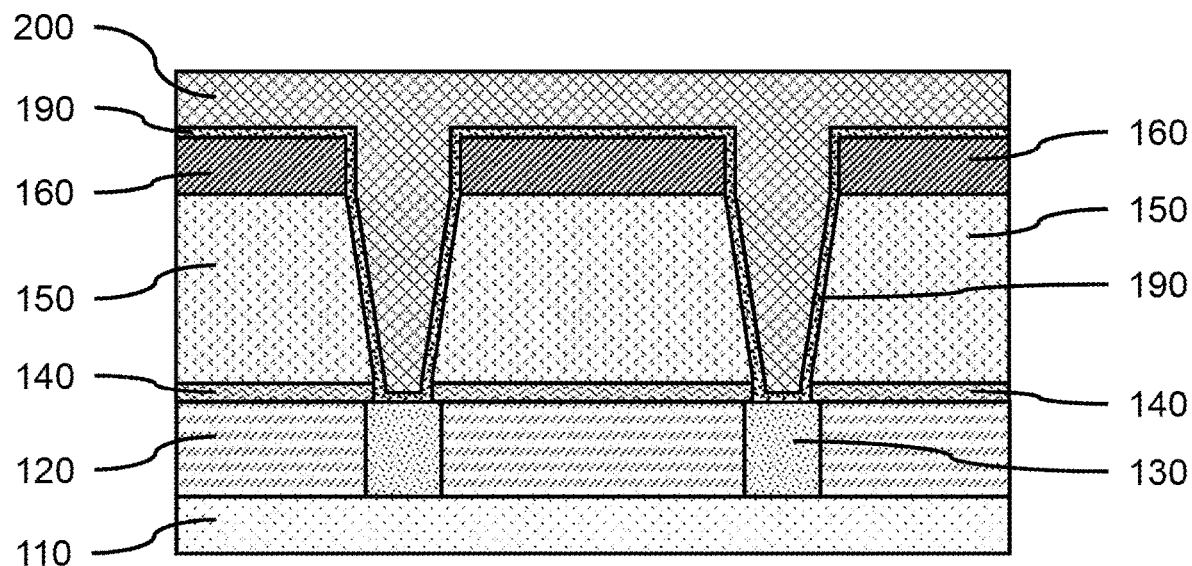
FIG. 5 is a cross-sectional side view showing a conductive trench fill formed on the trench liner, in accordance with an embodiment of the present invention.

FIG. 5 is a cross-sectional side view showing a conductive trench fill formed on the trench liner, in accordance with an embodiment of the present invention.

In one or more embodiments, a conductive trench fill 200 can be formed on the trench liner 190 in the trenches 180 and on the patterned masking layer 160. The conductive trench fill 200 can be formed by a blanket deposition, for example, MOCVD, PVD, ALD, PEALD, electroplating, and combinations thereof. Electroplating can be done on a seed layer. The conductive trench fill 200 can extend above the trench openings and cover the masking layer 160.

In various embodiments, the conductive trench fill 200 can be a conductive material, including, but not limited to, a metal, for example, copper (Cu), aluminum (Al), tungsten (W), molybdenum (Mo), a metal compound, for example, tantalum nitride (TaN), titanium nitride (TiN), ruthenium (Ru), rhodium (Rh), cobalt (Co), and iridium (Jr), conductive carbon, for example, graphene, carbon nanotubes, and combinations thereof.

Figure 6:
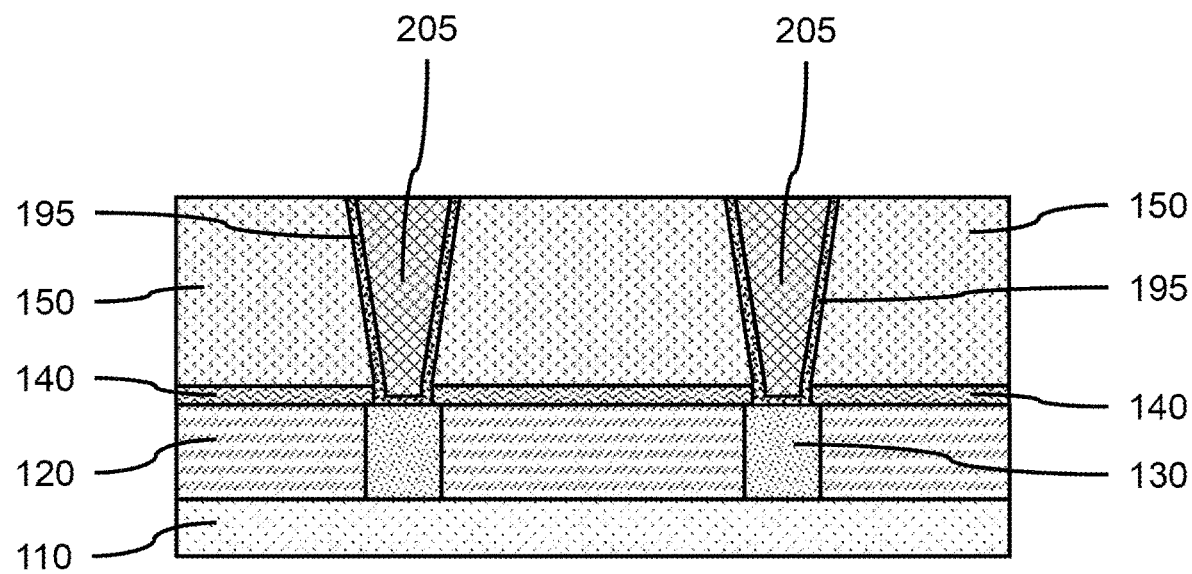
FIG. 6 is a cross-sectional side view showing upper portions of the conductive trench fill and trench liner, and the patterned masking layer, removed to expose the interlayer dielectric layer, in accordance with an embodiment of the present invention.

FIG. 6 is a cross-sectional side view showing upper portions of the conductive trench fill and trench liner, and the patterned masking layer, removed to expose the interlayer dielectric layer, in accordance with an embodiment of the present invention.

In one or more embodiments, the upper portions of the conductive trench fill 200 and trench liner 190 above the interlayer dielectric layer 150, and the masking layer 160, can be removed, for example, by etching, chemical-mechanical polishing (CMP), or a combination thereof. The removal of the upper portions of the conductive trench fill 200, trench liner 190, and masking layer 160 can expose the interlayer dielectric layer 150, and form sacrificial trench layers 195 and conductive trench plugs 205 on one or more conductive lines 130.

Figure 7:
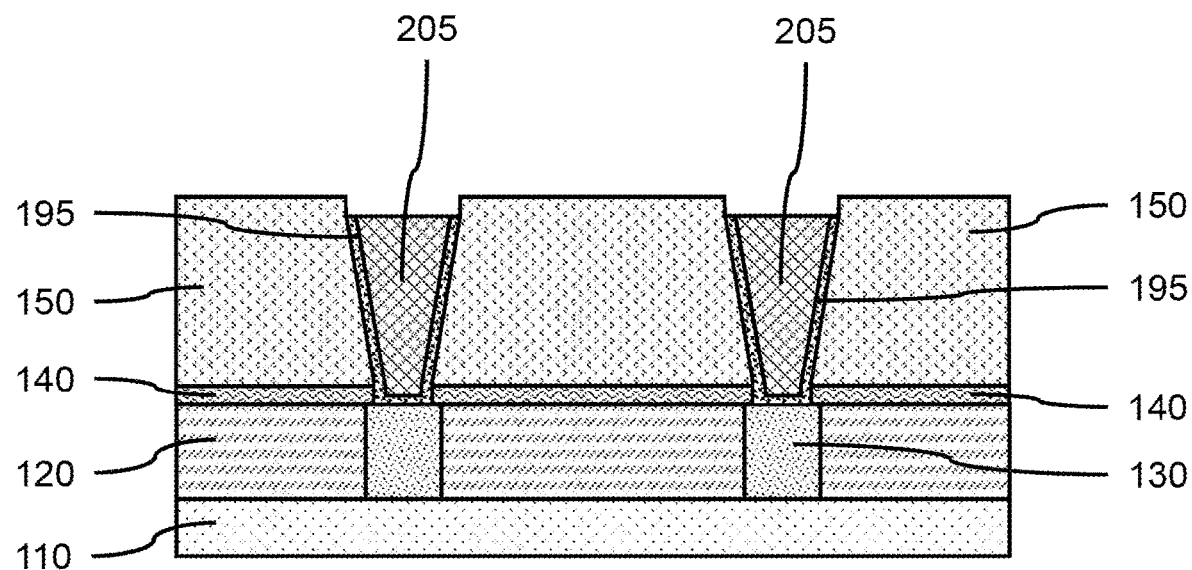
FIG. 7 is a cross-sectional side view showing recessing of the sacrificial trench layers and conductive trench plugs in the trench, in accordance with an embodiment of the present invention.

FIG. 7 is a cross-sectional side view showing recessing of the sacrificial trench layers and conductive trench plugs in the trench, in accordance with an embodiment of the present invention.

In one or more embodiments, the sacrificial trench layers 195 and conductive trench plugs 205 can be recessed by a wet chemical etch, for example, using alanine. Recessing the top of the metal lines can allow for a greater overlay margin, when trying to land a line/via above. This technique is known as "fully aligned via".

In various embodiments, the sacrificial trench layers 195 and conductive trench plugs 205 can be recessed by about 2 nm to about 10 nm, or about 4 nm to about 7 nm, although other recess depths are also contemplated.

Figure 8:
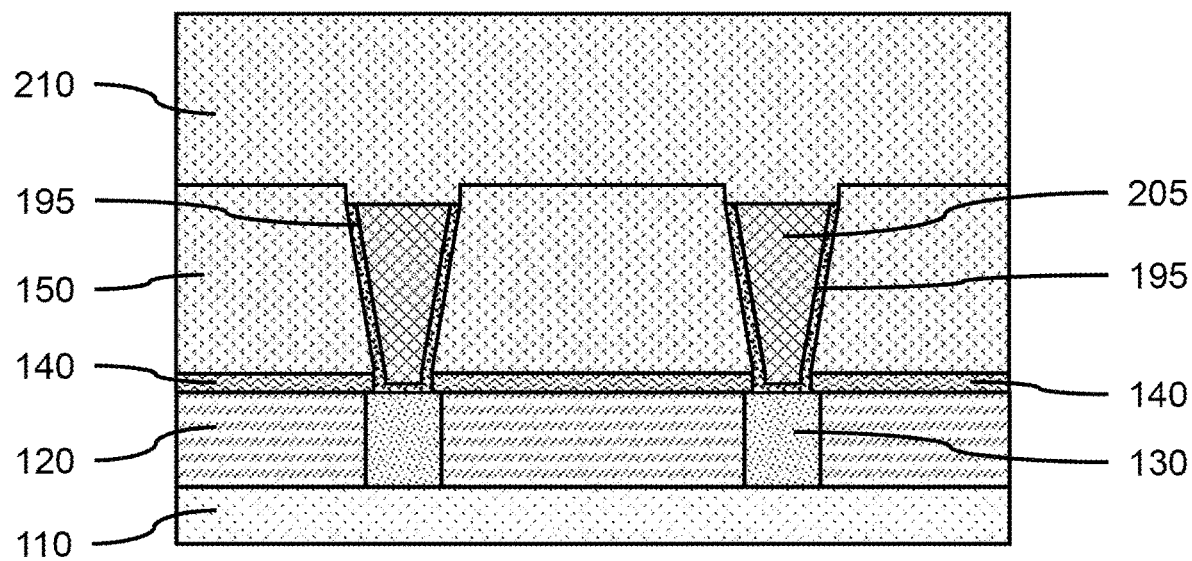
FIG. 8 is a cross-sectional side view showing a cover layer formed on the interlayer dielectric layer and recessed sacrificial trench layers and conductive trench plugs, in accordance with an embodiment of the present invention.

FIG. 8 is a cross-sectional side view showing a cover layer formed on the interlayer dielectric layer and recessed sacrificial trench layers and conductive trench plugs, in accordance with an embodiment of the present invention.

In one or more embodiments, a cover layer 210 can be formed on the interlayer dielectric layer 150, and recessed sacrificial trench layers 195 and conductive trench plugs 205. The cover layer 210 can be formed by a blanket deposition, for example, CVD, PECVD, spin-on.

In various embodiments, the cover layer 210 can be an insulating, dielectric layer including, but, not limited to, silicon oxide (SiO), a low-k dielectric, and combinations thereof.

In various embodiments, the cover layer 210 can have a thickness in a range of about 5 nm to about 50 nm, or about 10 nm to about 40 nm, or about 20 nm to about 30 nm, although other thicknesses are also contemplated.

Figure 9:
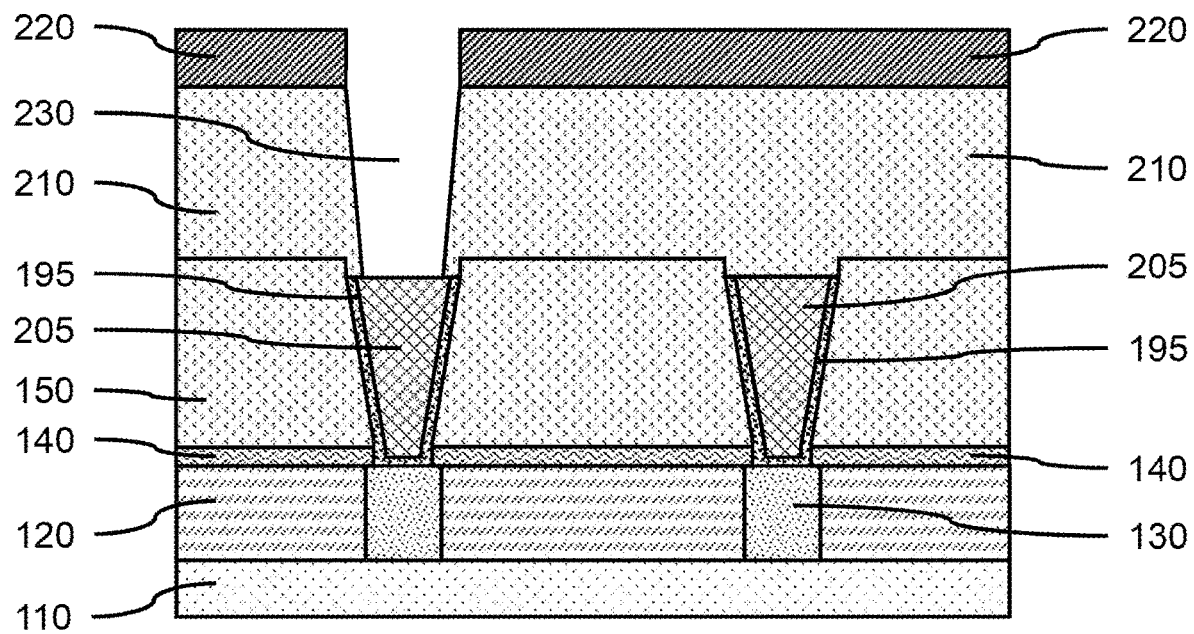
FIG. 9 is a cross-sectional side view showing a second patterned masking layer on the cover layer and a channel formed in the cover layer exposing the recessed conductive trench fill, in accordance with an embodiment of the present invention.

FIG. 9 is a cross-sectional side view showing a second patterned masking layer on the cover layer and a channel formed in the cover layer exposing the recessed conductive trench fill, in accordance with an embodiment of the present invention.

In one or more embodiments, a second patterned masking layer 220 can be formed on the cover layer 210, where the second masking layer 220 can be a resist material that can be patterned and developed using lithographic processes to form one or more openings in the second masking layer 220. The openings in the second masking layer 220 can be positioned over a conductive trench plug 205.

In one or more embodiments, one or more channels 230 can be formed in the cover layer 210 using a selective, directional etch (e.g., RIE). The channels 230 can expose a top surface of the conductive trench plugs 205. A portion of the cover layer 210 can be between an upper region of the interlayer dielectric layer 150 and the sidewall of the channel 230, due to the recessing of the sacrificial trench layers 195 and conductive trench plugs 205.

Figure 10:
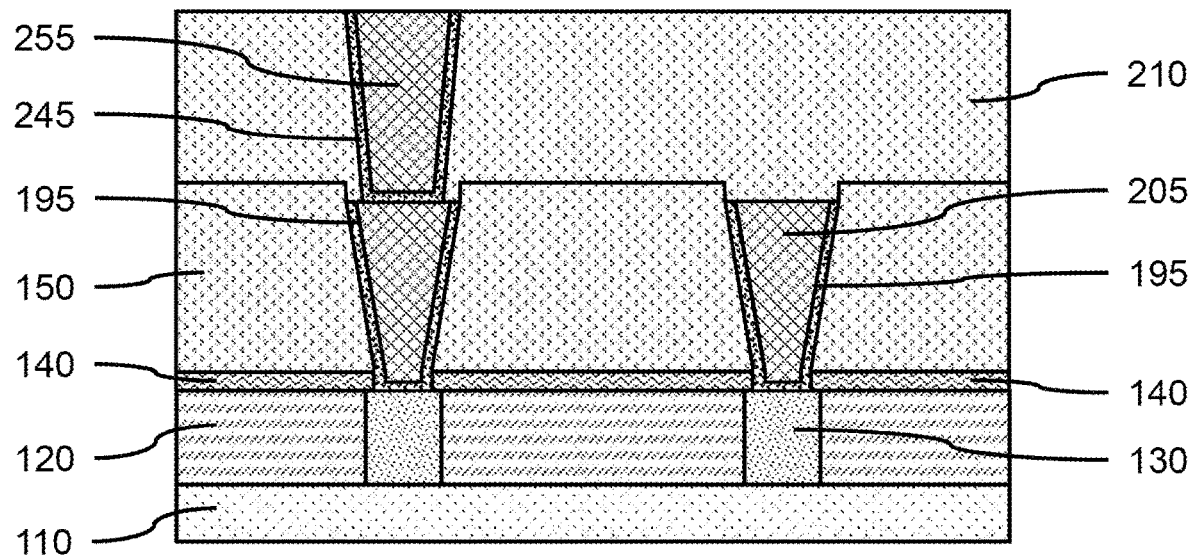
FIG. 10 is a cross-sectional side view showing a channel liner and conductive channel fill in the channel, in accordance with an embodiment of the present invention.

FIG. 10 is a cross-sectional side view showing a channel liner and conductive channel fill in the channel, in accordance with an embodiment of the present invention.

In one or more embodiments, a channel liner can be formed on the second patterned masking layer 220 and in the one or more channels 230, where the channel liner can be formed by a conformal deposition (e.g., ALD, PEALD). A conductive channel fill can be formed on the channel liner and in the channel(s) 230. An upper portion of the conductive channel fill, channel liner, and second patterned masking layer 220 can be removed to form a sacrificial channel layer 245 and a conductive channel plug 255 in each channel 230. In various embodiments, the channel liner can be formed on the flat regions above and between the conductive lines 130, which can be removed later during a chemical-mechanical polishing.

In various embodiments, the channel liner and sacrificial channel layer 245 can be a conductive metal, for example, molybdenum (Mo), ruthenium (Ru), rhodium (Rh), cobalt (Co), and combinations thereof.

In various embodiments, the channel liner and sacrificial channel layer 245 can have a thickness in a range of about 0.5 nm to about 5 nm, or about 1 nm to about 3 nm, although other thicknesses are also contemplated. The channel liner and sacrificial channel layer 245 can be sufficiently thick to promote a high quality gap fill of a conductive metal line material, and can reduce electromigration of the primary conductor in the conductive metal line.

Figure 11:
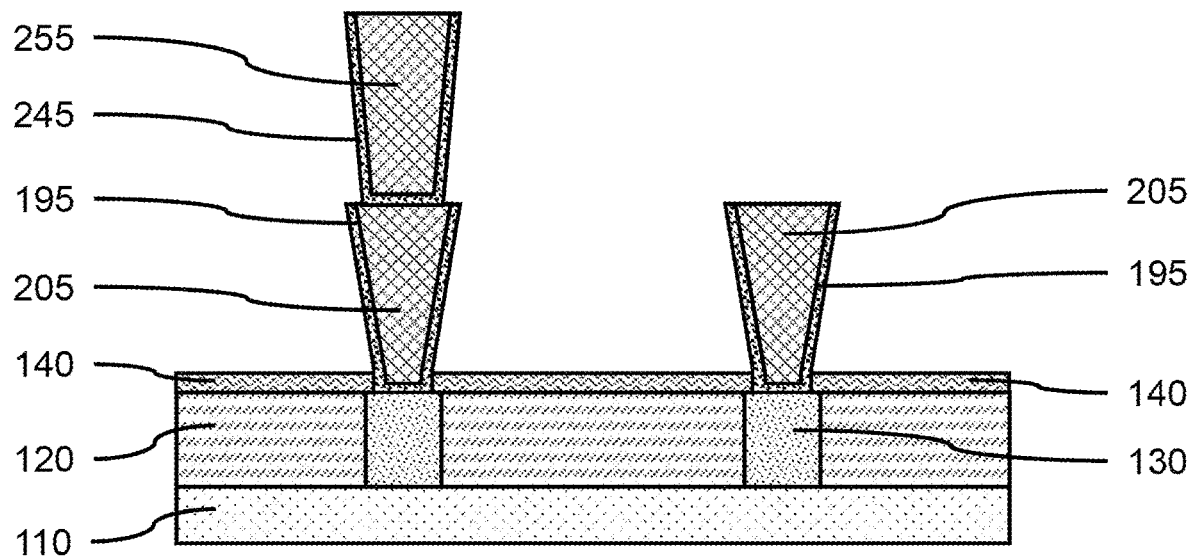
FIG. 11 is a cross-sectional side view showing a top via on a lower via after removing the cover layer and interlayer dielectric layer, in accordance with an embodiment of the present invention.

FIG. 11 is a cross-sectional side view showing a top via on a lower via after removing the cover layer and interlayer dielectric layer, in accordance with an embodiment of the present invention.

In one or more embodiments, the cover layer 210 and interlayer dielectric layer 150 can be removed to expose the sacrificial channel layers 245 on the conductive channel plugs 255, and the sacrificial trench layers 195 on the conductive trench plugs 205. The cover layer 210 and interlayer dielectric layer 150 can be the same material, so the cover layer 210 and interlayer dielectric layer 150 can be removed using the same isotropic etch, for example, a wet chemical etch or dry plasma etch.

Figure 12:
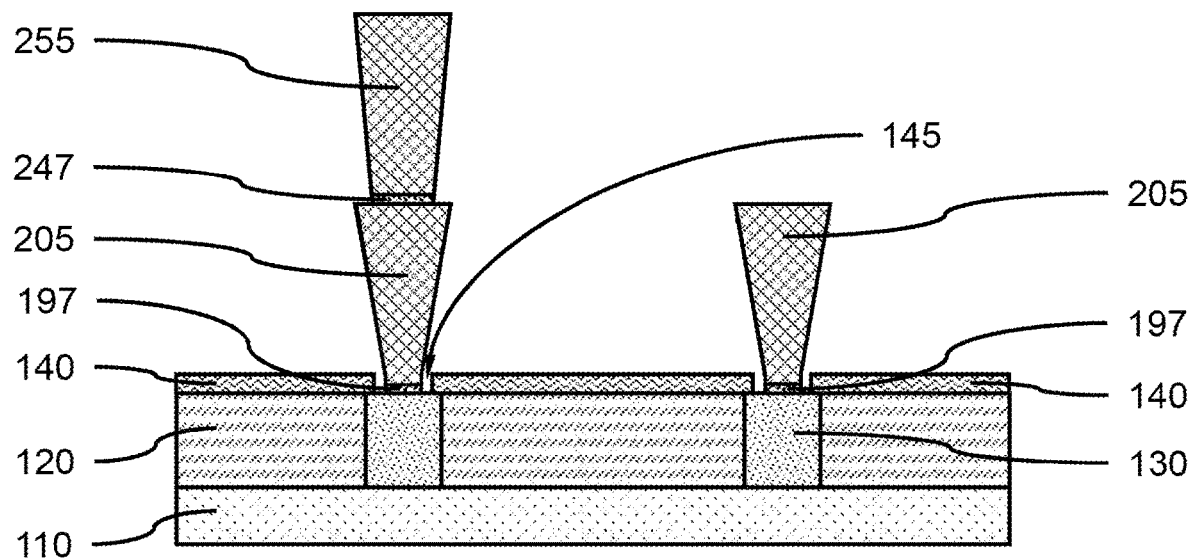
FIG. 12 is a cross-sectional side view showing the conductive channel plug on a channel plate and conductive trench plug, in accordance with an embodiment of the present invention.

FIG. 12 is a cross-sectional side view showing the conductive channel plug on a channel plate and conductive trench plug, in accordance with an embodiment of the present invention.

In one or more embodiments, the exposed portions of the sacrificial channel layers 245 and sacrificial trench layers 195 can be removed using, for example, a wet chemical etch or dry plasma etch. Removal of the exposed portions of the sacrificial channel layers 245 and sacrificial trench layers 195 can form a trench plate 197 between the conductive lines 130 and the conductive trench plugs 205, and a channel plate 247 between the conductive channel plugs 255 and the conductive trench plugs 205. A gap 145 can be formed between the trench plates 197 and the etch stop layer 140 by removing the sacrificial trench layers 195 on the sidewalls of the conductive trench plugs 205.

Figure 13:
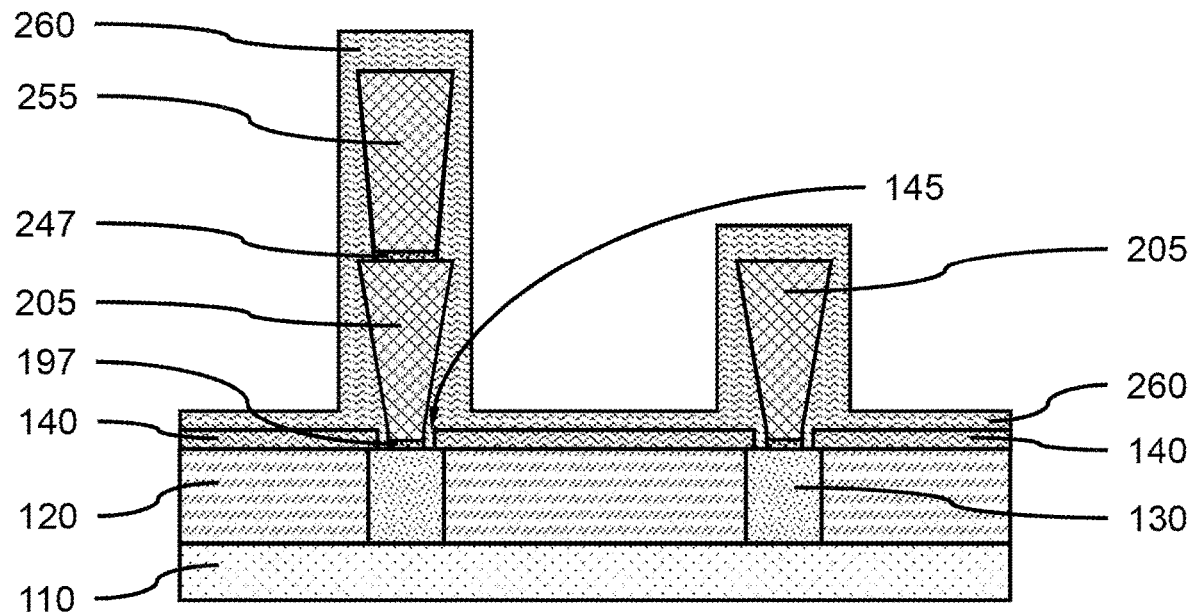
FIG. 13 is a cross-sectional side view showing a barrier layer on the conductive channel plug, channel plate, conductive trench plug, and trench plate, in accordance with an embodiment of the present invention.

FIG. 13 is a cross-sectional side view showing a barrier layer on the conductive channel plug, channel plate, conductive trench plug, and trench plate, in accordance with an embodiment of the present invention.

In one or more embodiments, a barrier layer 260 can be formed on the conductive channel plug 255, channel plate 247, conductive trench plug 205, and trench plate 197, where the barrier layer 260 can be formed by a conformal deposition (e.g., ALD, PEALD, PVD). The barrier layer 260 can fill in the gap 145 around the trench plate 197 on the conductive line 130.

In various embodiments, the barrier layer 260 can be a metal, for example, tantalum (Ta), a conductive or insulating metal compound, including, but not limited to, tantalum nitride (TaN), titanium nitride (TiN), tungsten nitride (WN), a dielectric barrier material, for example, silicon nitride (SiN), and combinations thereof. The barrier layer 260 can reduce or prevent the diffusion of metal atoms into a surrounding dielectric, which can reduce the reliability of a device. In various embodiments, the conductive metal and metal compound barrier layer can be masked and etched to electrically isolate adjacent conductive channel plugs 255, channel plates 247, conductive trench plugs 205, and trench plates 197 to prevent electrical shorting of conductive lines 130 and vias.

In various embodiments, the barrier layer 260 can have a thickness in a range of about 0.5 nm to about 5 nm, or about 1 nm, to about 3 nm, although other thicknesses are also contemplated. The barrier layer thickness can be sufficient for the specific material to reduce or prevent the diffusion of metal atoms into a surrounding dielectric.

Figure 14:
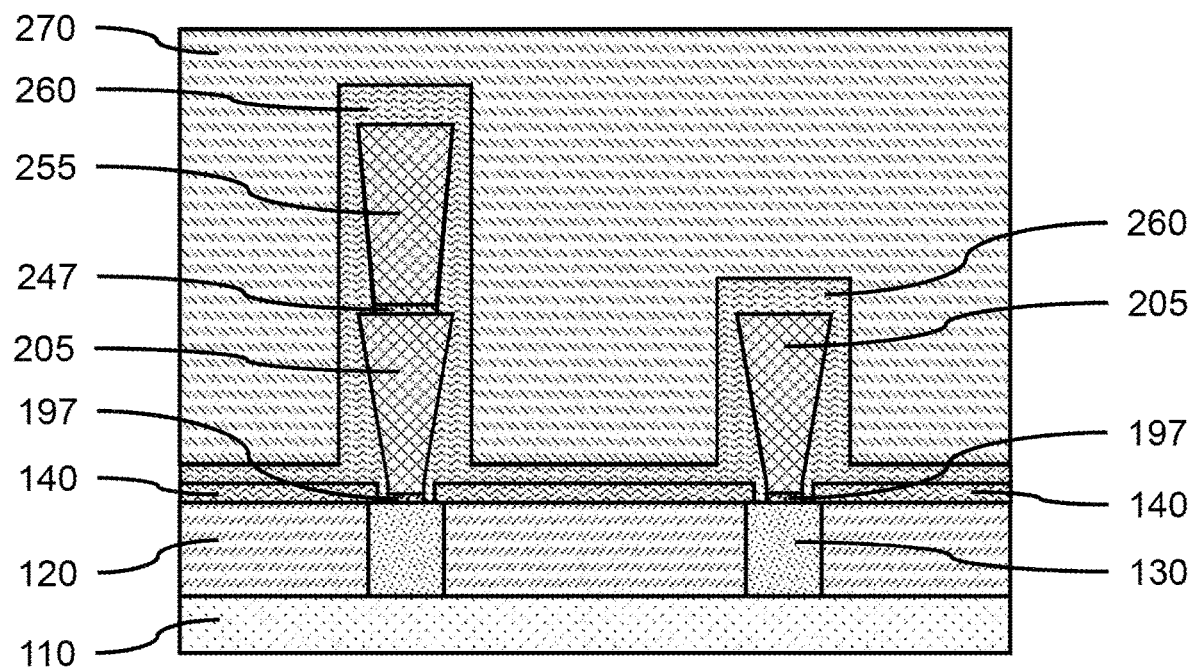
FIG. 14 is a cross-sectional side view showing a capping layer formed on the barrier layer, in accordance with an embodiment of the present invention.

FIG. 14 is a cross-sectional side view showing a capping layer formed on the barrier layer, in accordance with an embodiment of the present invention.

In one or more embodiments, a capping layer 270 can be formed on the barrier layer 260, where the capping layer 270 can be formed by a blanket deposition. In various embodiments, the capping layer 270 can be a metal compound, including, but not limited to, a metal nitride, for example, aluminum nitride (AlN), titanium nitride (TiN), aluminum nitride (AlN), aluminum oxide (AlO), a silicon nitride (SiN), a silicon carbide (SiC), and combinations thereof.

Figure 15:
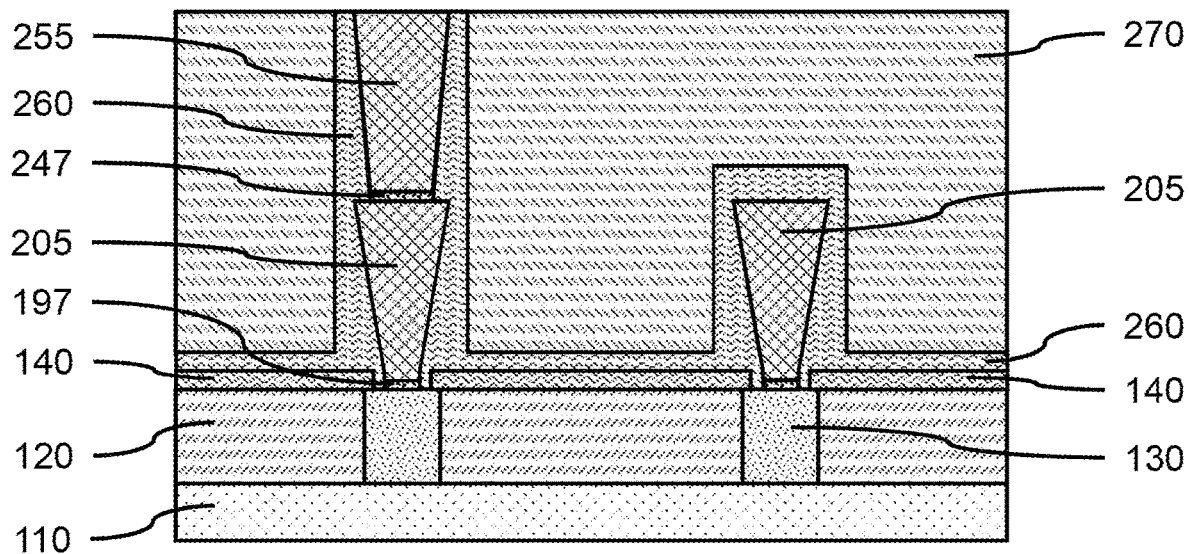
FIG. 15 is a cross-sectional side view showing removal of an upper portion of the capping layer and the barrier layer to expose the underlying conductive channel plug, in accordance with an embodiment of the present invention.

FIG. 15 is a cross-sectional side view showing removal of an upper portion of the capping layer and the barrier layer to expose the underlying conductive channel plug, in accordance with an embodiment of the present invention.

In one or more embodiments, an upper portion of the capping layer 270 and the barrier layer 260 can be removed to expose the underlying conductive channel plug 255. The upper portion of the capping layer 270 and the barrier layer 260 can be removed using selective, directional etching, and/or CMP.

Figure 16:
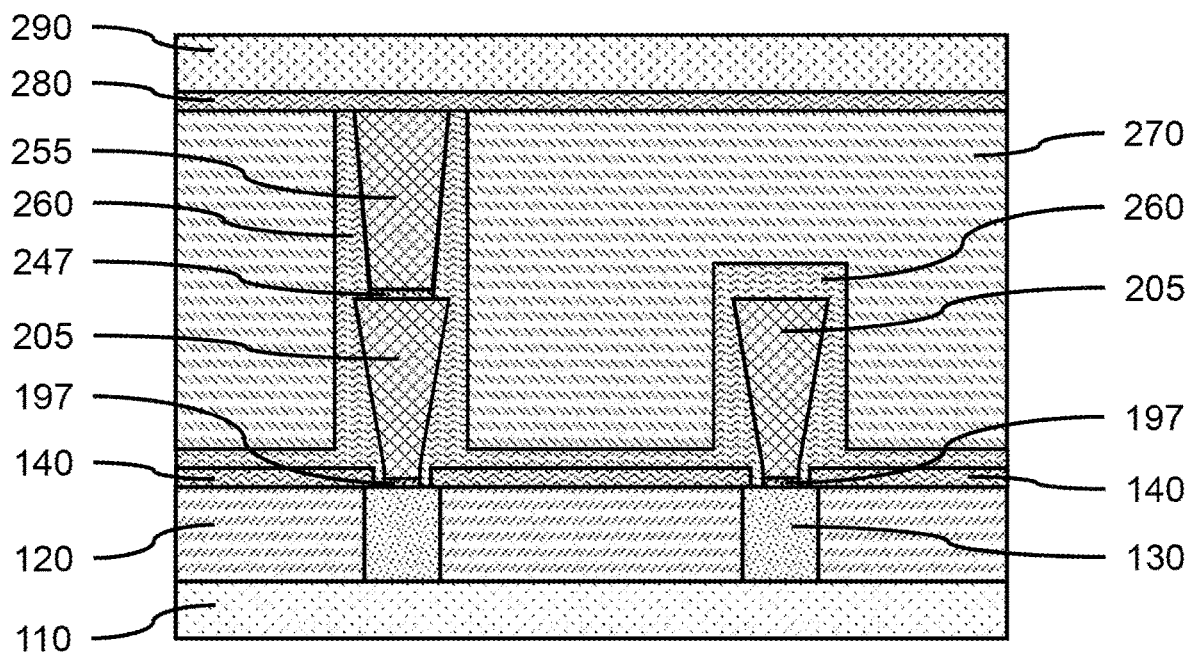
FIG. 16 is a cross-sectional side view showing a second etch stop layer and a second interlayer dielectric layer on the capping layer, in accordance with an embodiment of the present invention.

FIG. 16 is a cross-sectional side view showing a second etch stop layer and a second interlayer dielectric layer on the capping layer, in accordance with an embodiment of the present invention.

In one or more embodiments, a second etch stop layer 280 can be formed on the exposed surfaces of the capping layer 270, barrier layer 260, and conductive channel plug 255. A second interlayer dielectric layer 290 can be formed on the second etch stop layer 280, and the process repeated to form additional vias on top of the lower vias.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A top via, comprising:
   a trench plate on a conductive line wherein a gap is formed between an etch stop layer and the trench plate;
   a conductive trench plug on the trench plate;
   channel plate on the conducive trench plug;
   a conductive channel plug on the channel plate; and
   a barrier layer on the conductive channel plug, channel plate, conductive trench plug, and trench plate.

2. The top via of claim 1, further comprising a second trench plate and a second conductive trench plug on a second conductive line, wherein the barrier layer is also on the second trench plate, second conductive trench plug, and the second conductive line.

3. The top via of claim 2, further comprising a capping layer on the harrier layer.

4. The top via of claim 3, wherein the etch stop layer is in contact with the barrier layer.

5. The top via of claim 4, further comprising a second etch stop layer on the capping layer.

6. The top via of claim 1, wherein the barrier layer is in direct contact with the trench plate and the conductive line.

7. The top via of claim 6, wherein the trench plate is a conductive metal selected from the group consisting of molybdenum (Mo), ruthenium (Ru), rhodium (Rh), cobalt (Co), and combinations thereof.

8. The top via of claim 7, wherein the barrier layer is directly on an etch stop layer, conductive trench plug, and conductive channel plug.

9. The top via of claim 8, wherein the barrier layer is selected from the group consisting of tantalum (Ta), tantalum nitride (TaN), titanium nitride (TiN), tungsten nitride (WN), and combinations thereof.

10. A top via, comprising:
    air etch stop layer on a fill layer;
    a conductive line in the fill layer;
    a trench plate on a conductive line;
    a gap between the etch stop layer and the trench plate;
    a conductive trench plug on the trench plate;
    a channel plate on the conductive trench plug;
    conductive channel plug on the channel plate; and
    a barrier layer on the conductive channel plug, channel plate, conductive trench plug, and trench plate.

11. The top via of claim 10, wherein the barrier layer is in the gap between the etch stop layer and the trench plate.

12. The top via of claim 11, further comprising a capping layer on the barrier layer.

13. The top via of claim 12, farther comprising a second etch stop layer on the capping layer, conductive channel plug, and the barrier layer.

14. The top via of claim 13, wherein the harrier layer is directly on the conductive channel plug and conductive trench plug.

15. A top via comprising:
    a first etch stop layer on a fill layer;
    a conductive line in the fill layer;
    a trench plate on a conductive line, wherein there is a gap between the first etch stop layer and the trench plate;
    a conductive trench plug on the trench plate;
    a channel plate on the conductive trench plug;
    a conductive channel plug on the channel plate; and
    a harrier layer directly on the first etch stop layer, conductive line, conductive channel plug, channel plate, conductive trench Ow, and trench plate.

16. The top via of claim 15, further comprising a second etch stop layer directly on the barrier layer and the conductive channel plug.

17. The top via of claim 16, further comprising an interlayer dielectric layer on the second etch stop layer.

18. The top via of claim 16, further comprising a second trench plate and, a second conductive bench plug on a second conductive line, wherein the barrier layer is also on the second trench plate, second conductive trench plug, and the second conductive line.

19. The top via of claim 16, wherein the barrier layer is selected from the group consisting of tantalum (Ta), tantalum nitride (TaN), titanium nitride (TiN), tungsten nitride (WN), and combinations thereof.

* * * * *